United States Patent [19]

Kunitou

[11] Patent Number: 5,538,917
[45] Date of Patent: Jul. 23, 1996

[54] FABRICATION METHOD OF SEMICONDUCTOR INTEGRATED CIRCUIT DEVICE

[75] Inventor: Masao Kunitou, Tokyo, Japan

[73] Assignee: NEC Corporation, Tokyo, Japan

[21] Appl. No.: 319,536

[22] Filed: Oct. 7, 1994

[30] Foreign Application Priority Data

Oct. 7, 1993 [JP] Japan ................ 5-274795

[51] Int. Cl.⁶ ................................................. H01L 21/76
[52] U.S. Cl. ................................................ 437/72; 437/228
[58] Field of Search ................................ 437/69, 70, 72; 148/DIG. 85, DIG. 86, DIG. 117

[56] References Cited

U.S. PATENT DOCUMENTS

| | | | |
|---|---|---|---|
| 4,743,566 | 5/1988 | Bastiaens et al. | 437/69 |
| 5,134,089 | 7/1992 | Barden et al. | |

FOREIGN PATENT DOCUMENTS

| | | |
|---|---|---|
| 56-13770 | 2/1981 | Japan . |
| 59-84436 | 5/1984 | Japan . |
| 1244635 | 3/1988 | Japan . |
| 233915 | 2/1990 | Japan . |
| 3-266434 | 11/1991 | Japan . |

Primary Examiner—George Fourson
Attorney, Agent, or Firm—Popham, Haik, Schnobrich & Kaufman, Ltd.

[57] ABSTRACT

A fabrication method of a semiconductor integrated circuit device is provided. A patterned oxidation-resistant film such as silicon nitride film is formed on or over a semiconductor substrate. Using the patterned oxidation-resistant film as a mask, the substrate is then thermally oxidized so that a first oxide film for isolation is selectively formed to define active regions on the substrate. After the oxidation-resistant film is removed, the substrate is thermally oxidized so that a second oxide film is formed on the active regions, without adding any process step. Then, the substrate is etched until the second oxide film is entirely removed so that the surfaces of the active regions are exposed. During this process step, the first oxide film is partially removed. Subsequently, a patterned conductor film is formed on the first oxide film and then, it is removed from the first oxide. Even if steps or protrusions produced on the first oxide film due to the "bird's head phenomenon", the steps or protrusions can be reduced in size or removed entirely together with the partial removal of the first oxide film. No leavings of the conductor film is produced on the first oxide film, avoiding short-circuit of the patterned conductor film.

10 Claims, 8 Drawing Sheets

FABRICATION METHOD OF SEMICONDUCTOR INTEGRATED CIRCUIT DEVICE

BACKGROUND OF THE INVENTION

1. Field of the Invention

The present invention relates to a fabrication method of semiconductor integrated circuit device, and more particularly, to a fabrication method of a semiconductor integrated circuit device with a patterned field oxide formed on a semiconductor substrate by selective oxidation.

2. Description of the Prior Art

With semiconductor integrated circuit devices of this type, an isolation region is generally provided to isolate adjacent elements or components such as transistors from each other. As a technique to form the isolation region, a selective oxidation technique called "Local Oxidation of Silicon (LOCOS)", in which a semiconductor substrate is locally oxidized to form the patterned field oxide film, has been chiefly used in most of the semiconductor integrated circuit devices.

Figure 1:
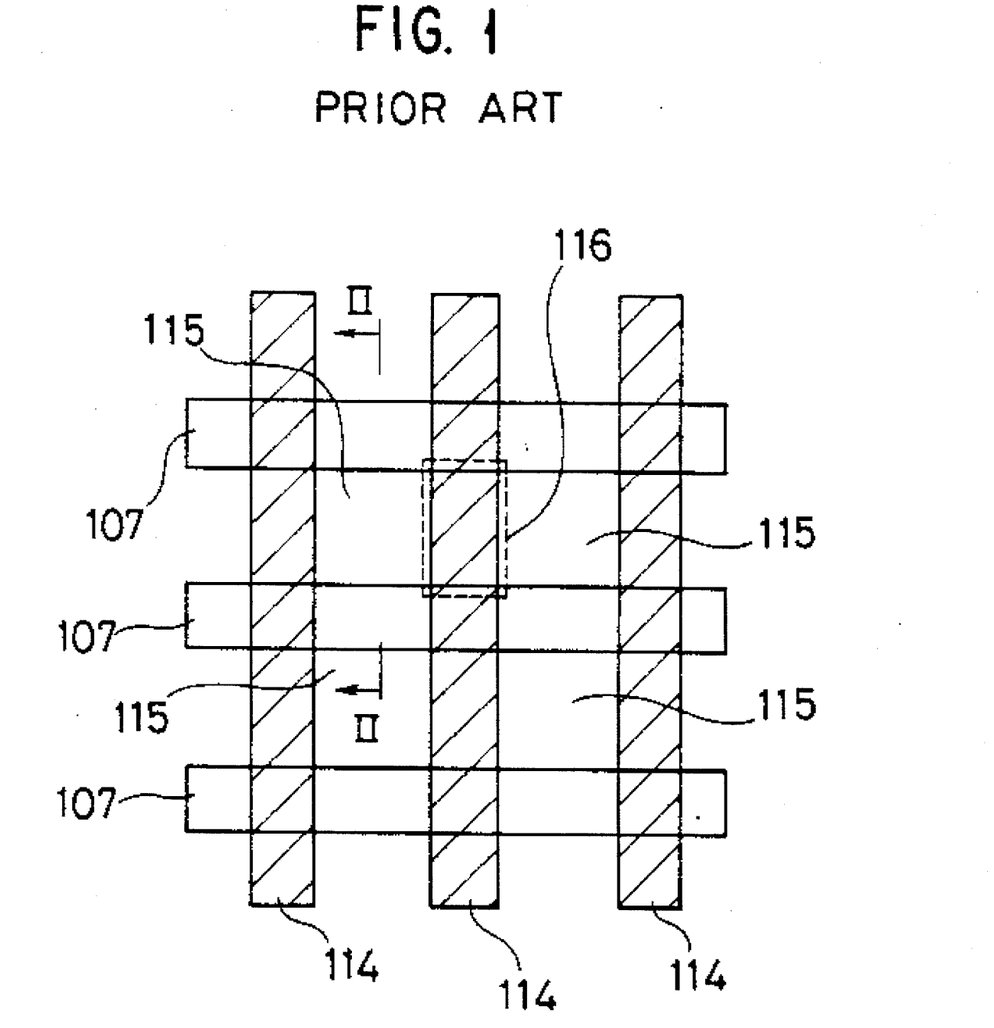
FIG. 1 is a plan view showing part of a memory cell array of a NAND-type mask ROM device.

As an example of the conventional fabrication methods of the semiconductor devices of this type, a fabrication method of a NAND-type mask Read Only Memory (ROM) device using the LOCOS technique is described below. FIG. 1 is a plan view showing part of a memory cell array of the mask ROM device, and FIGS. 2A to 2J are cross-sections along the line II—II in FIG. 1 showing the fabrication process steps of the ROM device, respectively.

The memory cell array contains a plurality of Metal-Oxide-Semiconductor (MOS) transistors and a plurality of capacitors arranged in a matrix array on a p-type silicon substrate 101. On the substrate 101, there are a plurality of isolation lines 107 formed by a field oxide film patterned to linear shapes and a plurality of word lines 114. The field oxide film 107 is made of silicon dioxide ($SiO_2$). The word lines 114 are made of stacked polysilicon and tungsten silicide ($WSi_2$) films 112 and 113 patterned to linear shapes, respectively. The isolation lines 107 and the word lines 114 are perpendicular to each other.

The isolation lines 107 define active regions 106 in the surface area of the substrate 101. Each of the active regions 106 is between adjacent two of the isolation lines 107. The isolation lines 107 also define inactive regions 105 in the surface area of the substrate 101. Each of the inactive regions 105 is disposed under each of the isolation lines 107. The word lines 114 serve as gate electrodes of the MOS transistors in the corresponding active regions 106, respectively.

Each of the memory cells contains MOS transistor and a capacitor, both of which are provided in corresponding one of the active regions 106. The MOS transistor is composed of a pair of source/drain regions 115 formed in corresponding active region 106 and a gate electrodes 114 disposed on the substrate 101 through a gate oxide film 111. The pair of the source/drain regions 115 are here formed of $N^+$-type diffusion regions disposed at respective sides of a corresponding word line 114. A channel area is formed under the gate electrode 114 between the pair of the source/drain regions 115 in the active region 106.

Coded MOS transistors of the memory cells are of the enhancement (normally off) type, and uncoded MOS transistors are of the depletion (normally on) type. In the channel areas of the depletion-type MOS transistors, n-type diffusion regions 116 are provided to form channels therein by ion-implantation or the like, respectively.

Figure 2A:
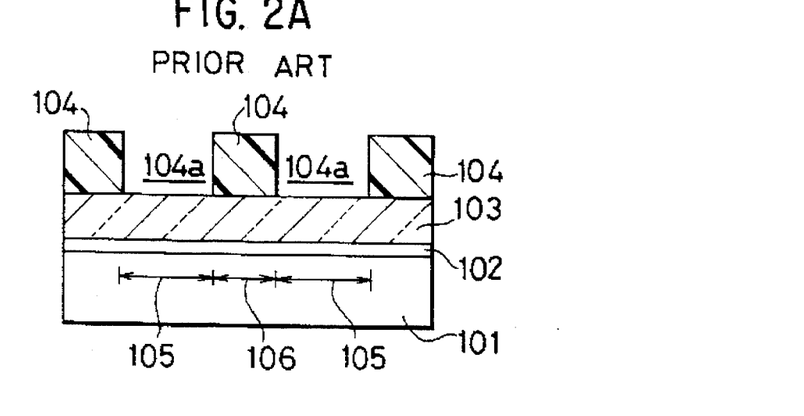
FIGS. 2A to 2J are cross-sections along the line II—II in FIG. 1 showing a fabrication process steps of the mask ROM device in FIG. 1, respectively.

The memory cell array of the mask ROM device described above is fabricated by the following process steps:

First, as a pad oxide film 102, a silicon dioxide ($SiO_2$) film with a thickness of about 400 Å is grown on the entire surface of the p-type silicon substrate 101. A silicon nitride ($Si_3N_4$) film 103 with a thickness of about 1200 Å is then formed on the pad oxide film 102 entirely, as shown in FIG. 2A. A photoresist film 104 is formed on the silicon nitride film 103 and the film 104 is patterned to have openings or windows 104a at positions corresponding to the respective inactive regions 105, as shown in FIG. 2A.

Figure 2B:
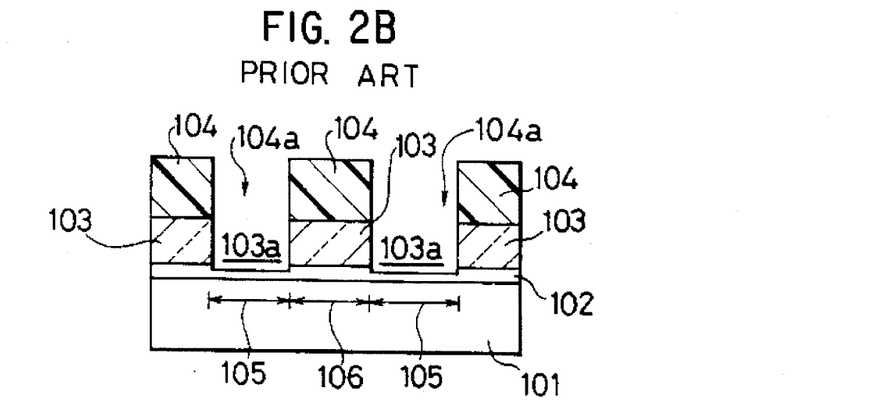
Figure 2C:
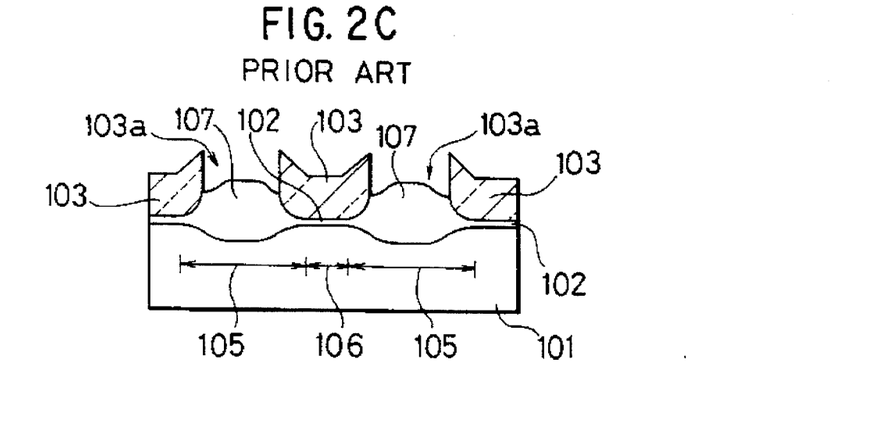

Next, using the patterned photoresist film 104 as a mask, the silicon nitride film 103 is selectively removed by etching to form openings or windows 103a, as shown in FIG. 2B. At this time, the surface area of the pad oxide film 102 is also partially etched at positions under the respective windows 103a. The patterned photoresist film 104 is then removed. Using the patterned silicon nitride film 103 as a mask, the surface area of the silicon substrate 101 is selectively, thermally oxidized to form a thick silicon dioxide ($SiO_2$) film in the inactive regions 105 as the field oxide film 107, as shown in FIG. 2C. The pad oxide film 102 is incorporated into the field oxide film 107 during this process.

Figure 2D:
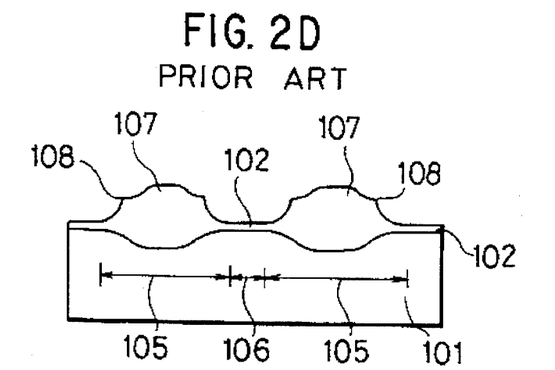

The patterned silicon nitride film 103 is then removed by etching using phosphoric acid or the like. At this time, as shown in FIG. 2D, the field oxide film 107 thus selectively formed has steps or protrusions 108 produced at both sides of the film 107 near the patterned silicon nitride film 103, which means that "the bird's head phenomenon" arises.

Figure 2E:
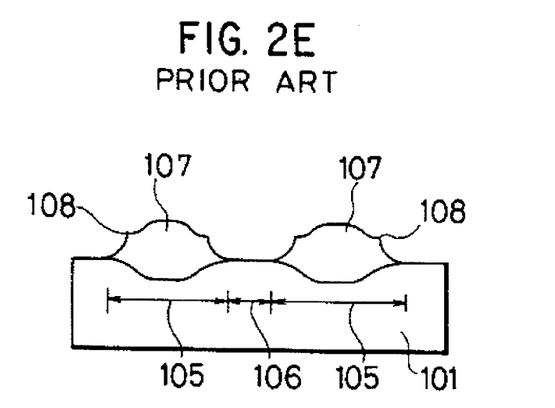

Subsequently, the pad oxide film 102 remaining in the active regions 106 is removed by etching using hydrofluoric acid so that the surfaces of the active regions 106 are exposed, as shown in FIG. 2E.

Figure 2F:
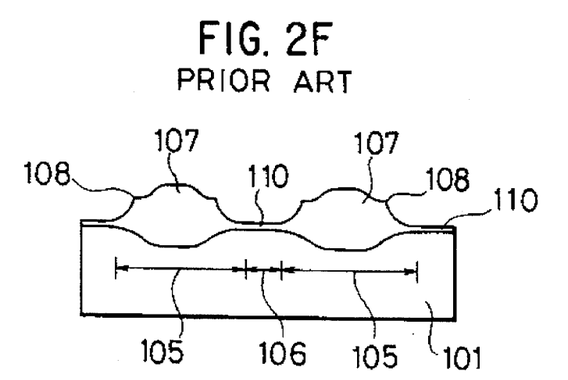

The substrate 101 is then subjected to heat-treatment under an oxygen atmosphere so that a silicon dioxide film 110 with a thickness of about 200 Å is selectively formed on the active regions 106, as shown in FIG. 2F. During this process, the field oxide film 107 is also grown.

To adjust the threshold voltages of the n- and p-channel MOS transistors provided in the peripheral circuitry (not shown) of the ROM device, dopant ions are implanted into the substrate 101.

Figure 2G:
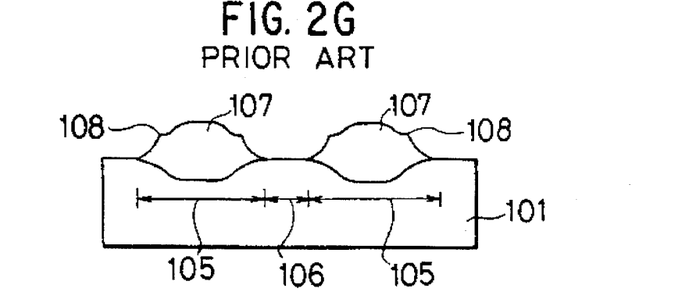

Then, the silicon dioxide film 110 formed in the active regions 106 is selectively removed by etching using hydrofluoric acid or the like so that the surfaces of the active regions 106 are exposed, as shown in FIG. 2G. During this process, the surface of the field oxide film 107 is also etched.

Figure 2H:
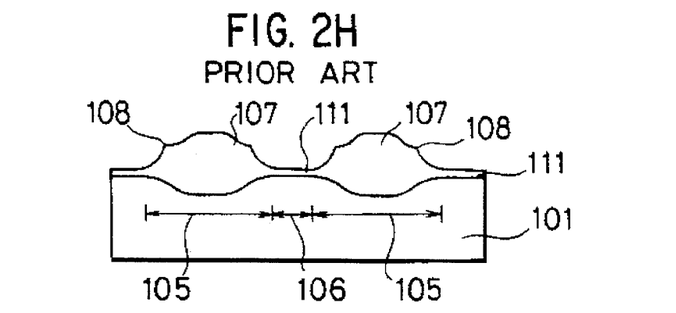

The substrate 101 is then subjected to heat-treatment under an oxygen atmosphere again so that a silicon dioxide film 111 with a thickness of about 200 Å is selectively formed on the active regions 106 as the gate oxide film, as shown in FIG. 2H.

Figure 2I:
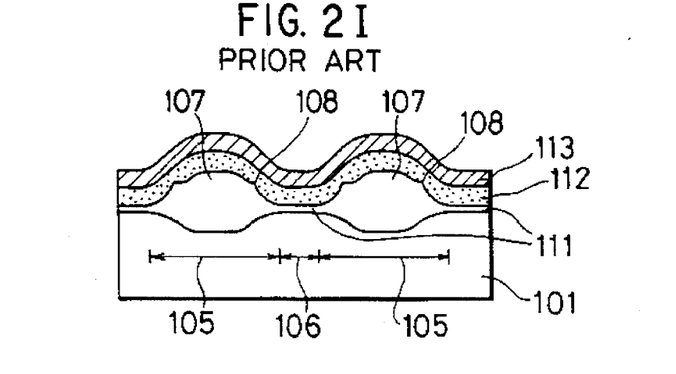

The polysilicon film 112 with a thickness of about 1000 to 2000 Å and the tungsten silicide film 113 with a thickness of about 1000 to 2000 Å are successively formed to cover the entirety of the substrate 101. Thus, the gate oxide film 111 formed on the active regions 106 and the field oxide film 107 formed on the inactive regions 105 are covered with the films 12 and 113, as shown in FIG. 2I.

The polysilicon film 112 and the tungsten silicide film 113 are patterned to form the gate electrodes 114 acting also as the word lines by dry etching. At this time, since the cross—section along the line II—II in FIG. 1 is parallel to the word lines 114, the films 112 and 113 do not appear in FIG. 2J.

Thereafter, using the patterned field oxide film 107 and the gate electrodes 114 as a mask, arsenic ions are selectively implanted into the respective active regions 106 to form the pairs of the $n_+$-type source/drain regions.

Finally, a photoresist film (not shown) is formed to cover the entirety of the memory cell array. The photoresist film is then patterned to have windows at positions corresponding to the channel areas of the MOS transistors to be coded. Phosphorus ions are selectively implanted into the channel areas to form the n-type coded diffusion regions 116 through the corresponding gate electrodes 114.

With the fabrication method of the mask ROM device described above, the steps or protrusion 118 are produced on the field oxide film 107 due to the "bird's head phenomenon". Therefore, during the process step of forming the gate electrodes and the word lines 114 by patterning the tungsten silicide film 113 and the polysilicon film 112, the polysilicon film 112 is difficult to be etched satisfactorily due to the steps 108.

Figure 2J:
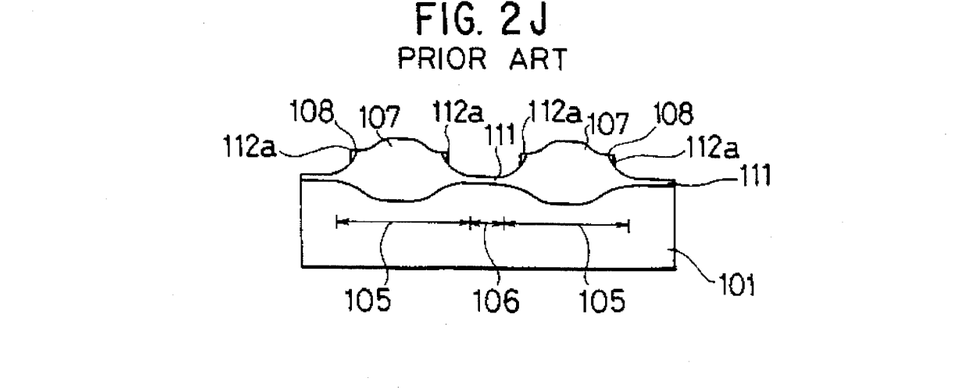

As a result, there is a problem that leavings 112a of the polysilicon film 112 are easy to be generated along the steps 108, as shown in FIG. 2J, giving short-circuit between the gate electrodes and/or the word lines 114.

If the polysilicon film 112 is removed satisfactorily during the above etching process in order to solve this problem, there arises another problem that the surfaces of the active regions 106 are to be damaged because the thin gate oxide film 111 is easy to be etched during the etching process.

SUMMARY OF THE INVENTION

Accordingly, it is an object of the present invention to provide a fabrication method of a semiconductor device in which steps or protrusions produced on a field oxide film due to the "bird's head phenomenon" can be reduced in size, or can be removed entirely, and as a result, leavings of a conductor formed on the field oxide film can be avoided during a removal process of the conductor.

A fabrication method of a semiconductor device according to the present invention contains the following steps:

First, an oxidation-resistant film is formed on or over a semiconductor substrate to be patterned to a given shape. Using the patterned oxidation-resistant film as a mask, the substrate is then thermally oxidized so that a first oxide film for isolation is selectively formed to define active regions on the substrate.

Next, the oxidation-resistant film is removed. Then, without adding any process step, the substrate is thermally oxidized so that a second oxide film is formed on the active regions.

The substrate having the first and second oxide films is subjected to etching until the second oxide film is entirely removed so that the surfaces of the active regions are exposed. During this process step, the first oxide film is partially removed.

Subsequently, a conductor is formed on the first oxide film and then is removed from the first oxide.

With the fabrication method of the present invention, the semiconductor substrate having the first and second oxide films is subjected to etching until the second oxide film is entirely removed so that the surfaces of the active regions are exposed, and the first oxide film is partially removed during this process step.

Therefore, even if steps or protrusions produced on the first oxide film for isolation due to the "bird's head phenomenon", the steps or protrusions can be reduced in size or can be removed entirely together with the partial removal of the first oxide film.

As a result, the conductor formed on the first oxide film can be avoided entirely during the removal process of the conductor, which means that no leavings of the conductor are produced on the first oxide film.

As the oxidation-resistant film, a silicon nitride film is preferably used; however, any other materials may be used if they have oxidation-resistant properties.

DETAILED DESCRIPTION OF THE PREFERRED EMBODIMENTS

A preferred embodiment of the present invention will be described below referring to FIGS. 3A to 3K attached.

As an embodiment of the present invention, a fabrication method of a NAND-type mask ROM device is described here. This mask ROM device has a memory cell array containing a plurality of MOS transistors and capacitors.

Similar to the mask ROM device shown in FIG. 1, on a p-type silicon substrate 1, there are a plurality of isolation lines 7 formed by a field oxide film patterned to linear shapes and a plurality, of word lines. The isolation lines are made of silicon dioxide ($SiO_2$). The word lines are made of stacked polysilicon and tungsten silicide ($WSi_2$) films 2 and 3 patterned to linear shapes, respectively. The isolation lines 7 and the word lines are perpendicular to each other.

The isolation lines 7 define active regions 6 in the surface area of the substrate 1. Each of the active regions 6 is defined between adjacent two of the isolation lines 7. The isolation lines 7 also define inactive regions 5 in the surface area of the substrate 1. Each of the inactive regions 5 is disposed under each of the isolation lines 7. The word lines serve as gate electrodes of the MOS transistors in the corresponding active regions 6, respectively.

Each of the memory cells contains an MOS transistor and a capacitor, both of which are provided in corresponding one of the active regions 6. The MOS transistor is composed of a pair of source/drain regions formed in corresponding one of the active regions 6 and a gate electrode disposed on the substrate 1 through a gate oxide film 11. The pair of the source/drain regions are here formed of $N^+$-type diffusion regions disposed at respective sides of corresponding one of the word lines. A channel area is formed under the gate electrode between the pair of the source/drain regions in the active region 6.

Coded ones of the MOS transistors of the memory cells are of the enhancement type, and uncoded ones thereof are of the depletion type. In the channel areas of the depletion-type MOS transistors, n-type diffusion regions are provided to form channels therein, respectively.

Figure 3A:
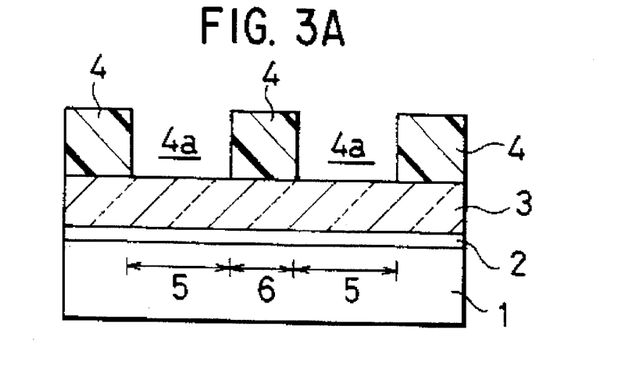
FIGS. 3A to 3K ace cross-sections along the line II—II in FIG. 1 showing a fabrication method of a semiconductor integrated circuit device according to an embodiment of the present invention, respectively.

The memory cell array of the mask ROM device described above is fabricated by the following process steps:

First, as a pad oxide film 2, a silicon dioxide (SiO$_2$) film with a thickness of about 400 Å is grown on a p-type silicon substrate 1 entirely by thermal oxidation. Next, as an oxidation-resistant film, a silicon nitride (Si$_3$N$_4$) film 3 with a thickness of about 1200 Å is deposited on the pad oxide film 2 entirely by Chemical Vapor Deposition (CVD), as shown in FIG. 3A.

The pad oxide film 2 serves to prevent the damage of the silicon substrate 1 due to the silicon nitride film 3.

A photoresist film 4 is then formed on the silicon nitride film 3. The film 4 is patterned to have openings or windows 4a at positions corresponding to the respective inactive regions 5 through exposure and development processes, as shown in FIG. 3A.

Figure 3B:
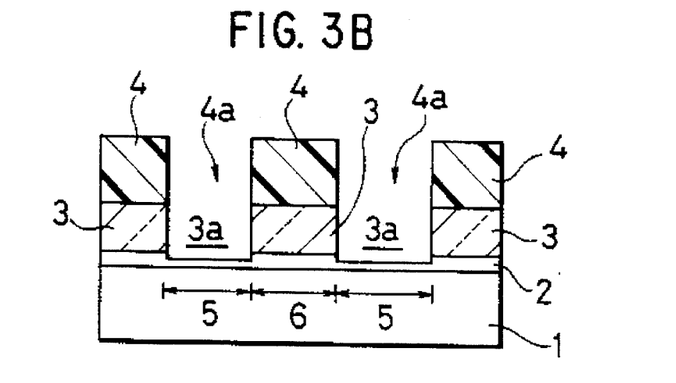

Next, using the patterned photoresist film 4 as a mask, the silicon nitride film 3 is selectively removed by etching, as shown in FIG. 3B. At this time, the surface area of the silicon dioxide film 2 is also partially etched at positions under the respective windows 3a. The patterned photoresist film 4 is then removed.

Figure 3C:
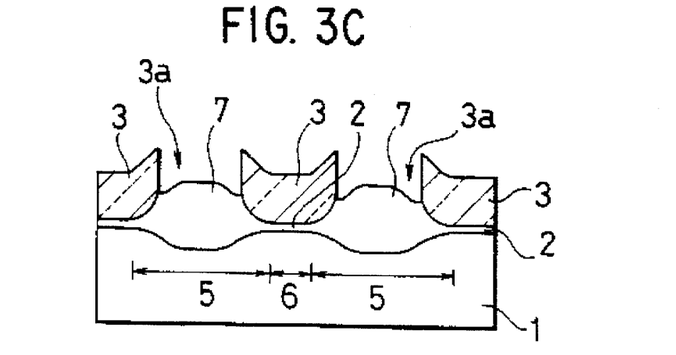

Using the patterned silicon nitride film 3 as a mask, as shown in FIG. 3C, the surface area of the silicon substrate 1 is selectively oxidized to form a thick silicon dioxide (SiO$_2$) film on the inactive regions 5 as the field oxide film 7 by thermal oxidation. The pad oxide film 2 is incorporated into the field oxide film 7 on the inactive regions 5 during this process.

Figure 3D:
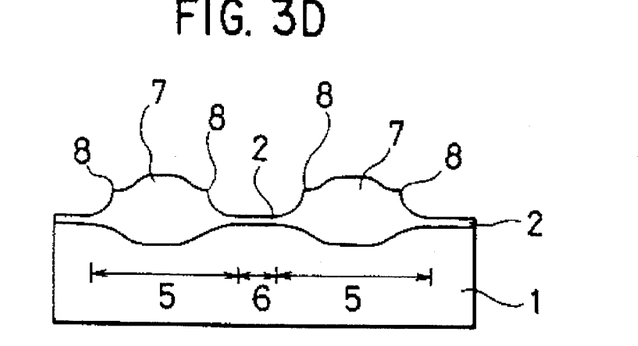

The patterned silicon nitride film 3 is then removed by etching using phosphoric acid. At this time, as shown in FIG. 3D, the field oxide film 7 thus selectively formed has steps or protrusions 8 produced at sides of the film 7 near the patterned silicon nitride film 3, which means that "the bird's head phenomenon" arises. The protrusions 8 are formed to extend along the word lines or the gate electrodes The above process steps are substantially the same as those in the conventional method shown in FIG. 2A to 2J.

Figure 3E:
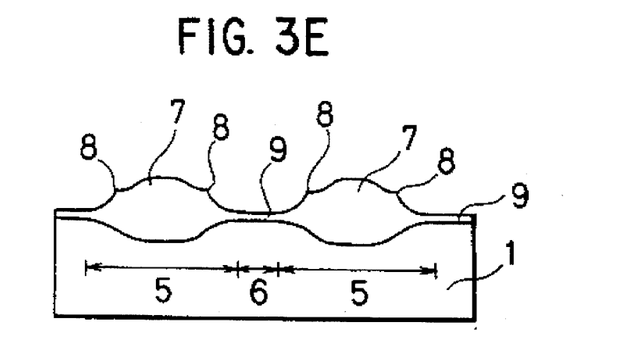

Subsequently, as shown in FIG. 3E, the substrate 1 is subjected to heat-treatment under an oxygen atmosphere. Thus, a silicon dioxide film is grown on the pad dioxide film 2 on the active regions 6, resulting in a silicon dioxide film 9 formed on the active regions 6. The film 9 has a total thickness of about 200 Å from the surface of the substrate 1 and is thicker than the pad oxide film 2 at the process step shown in FIG. 3D. During this process step, the field oxide film 7 is also grown on the inactive regions 5.

Figure 3F:
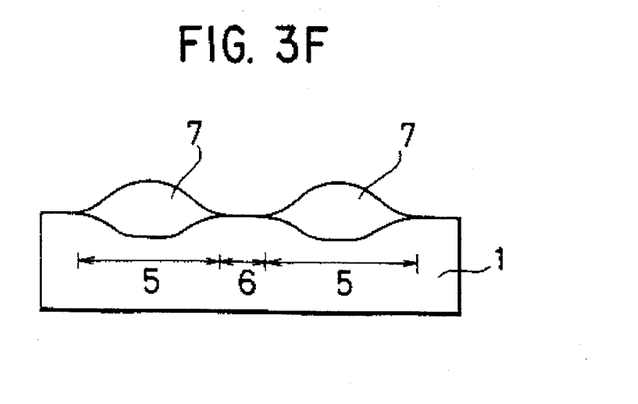

The silicon dioxide film 9 selectively grown on the active regions 6 is removed by etching using hydrofluoric acid so that the surfaces of the active regions 6 are exposed, as shown in FIG. 3F. During this process step, the surface area of the field oxide film 7 is etched, so that the steps or protrusions 8 on the field oxide film 7 are entirely removed, as shown in FIG. 3F.

The reason why the protrusions 8 are entirely removed or reduced in size by the process steps of (1) oxidizing the substrate 1 entirely by thermal oxidation without adding any process step after the step of removing the silicon nitride film 3 as the oxidation-resistant film from the substrate 1, and thereafter, (2) removing the silicon dioxide film 9 from the active regions 6 by etching has not been solved satisfactorily by the inventor. However, it is assumed that the stresses applied to the field oxide film 7 are relaxed during the thermal oxidation process step of (1) and that this stress relaxation relates to the removal or reduction in size of the protrusions 8.

Figure 3G:
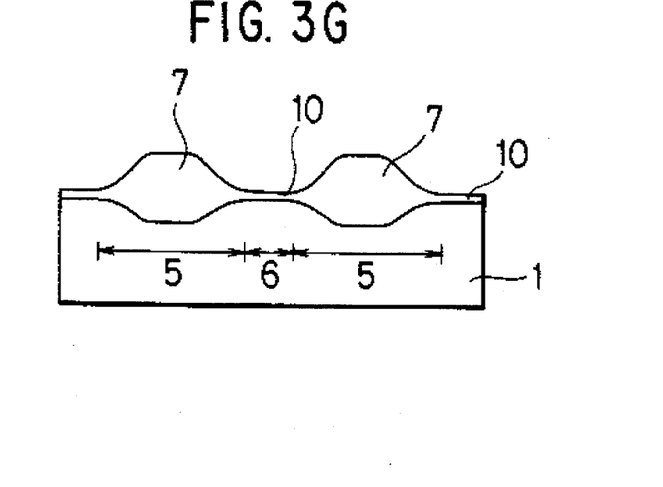

Subsequently, the substrate 1 is subjected to heat-treatment for the second time under an oxygen atmosphere so that a silicon dioxide film 10 with a thickness of about 200 Å is selectively formed on the exposed surface of the substrate 1 in the active regions 6, as shown in FIG. 3G. During this process, the field oxide film 7 is also grown. The silicon dioxide film 10 protects the surface of the substrate 1 during the following process step of ion-implantation.

Similar to the conventional fabrication method shown in FIGS. 2A to 2J, to adjust the threshold voltages of the n- and p-channel MOS transistors provided in the peripheral circuitry (not shown) of the ROM device, dopant ions are implanted in the substrate 1.

Figure 3H:
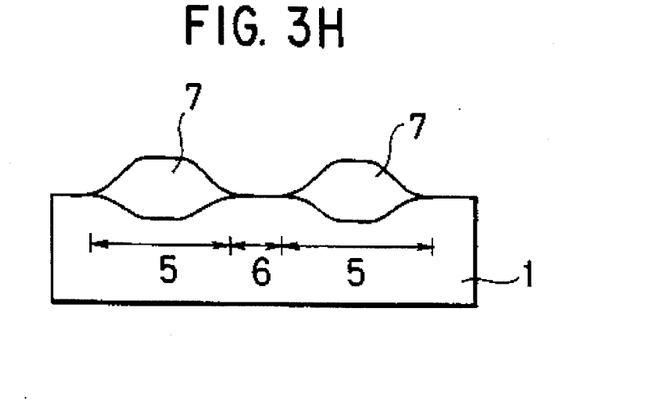

Then, the silicon dioxide film 10 formed in the active regions 6 is selectively removed by etching using hydrofluoric acid so that the surfaces of the substrate 1 in the active regions 6 are exposed as shown in FIG. 3H. During this process, the surface of the field oxide film 7 is also etched.

Figure 3I:
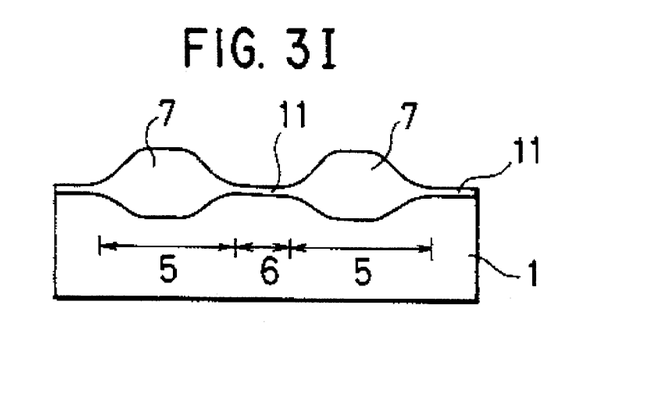

The substrate 1 is then subjected to heat-treatment under an oxygen atmosphere for the third time so that a silicon dioxide film 11 with a thickness of about 200 Å as the gate oxide film is selectively formed on the active regions 6, as shown in FIG. 3I.

Figure 3J:
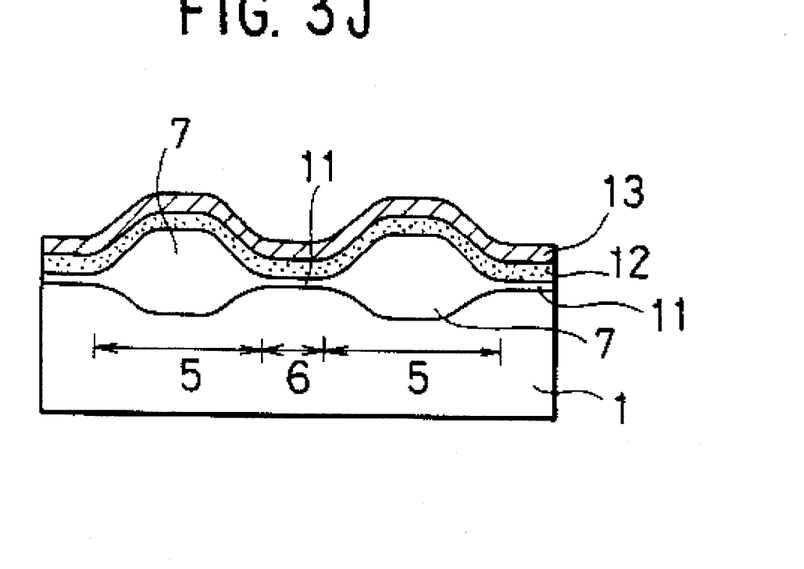

As shown in FIG. 3J, as a conductor, the polysilicon film 12 with a thickness of about 1000 to 2000 Å and the tungsten silicide film 13 with a thickness of about 1000 to 2000 Å are successively formed to cover the entirety of the substrate 1. Thus, the gate oxide film 11 formed on the active regions 6 and the field oxide film 7 formed on the inactive regions 5 are covered with the films 12 and 13.

The polysilicon film 12 and the tungsten silicide film 13 are patterned to form the gate electrodes acting also as the word lines by dry etching. At this time, since the cross-section along the line II–II is parallel to the gate electrodes or word lines, the films 12 and 13 do not appear in FIG. 3K.

Figure 3K:
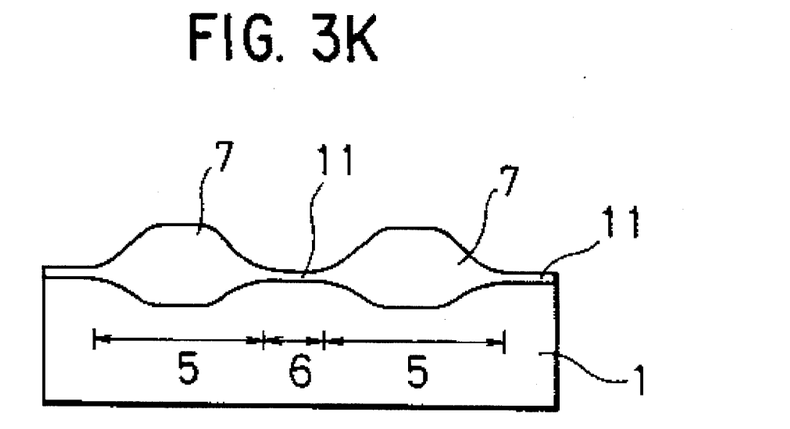

Since the protrusions 8 are removed from the field oxide film 7, the polysilicon film 12 is entirely removed by etching, which means that no leavings are produced on the filed oxide film 7.

Thereafter, using the patterned field oxide film 7 and the gate electrode as a mask, arsenic ions are selectively implanted into the active regions 6 to form the n$^+$-type diffusion regions as the source/drain regions.

Finally, a photoresist film is formed to cover the entirety of the memory cell array, and is patterned to have windows at positions corresponding to the channel areas of the memory cells to be coded. Then, phosphorus ions are selectively implanted into the channel areas to form the n-type coded diffusion regions through the corresponding gate electrodes.

As described above, with the fabrication method of this embodiment, during the process steps of selectively forming the inactive regions 5 or isolation lines on the semiconductor substrate 1, the substrate 1 is entirely oxidized by thermal oxidation without adding any process step after the step of removing the silicon nitride film 3 as the oxidation-resistant film from the substrate 1, and thereafter, the silicon dioxide film 9 is removed from the active regions 6 by isotropic etching to expose the surfaces of the active regions 6.

Therefore, the protrusions or steps 8 produced on the field oxide film 7 due to the "bird's head phenomenon" can be removed entirely or reduced in size. As a result, leavings of a conductive film do not formed on the field oxide film 7 during the removal process of the polysilicon film 12 as part of the conductor. This means that no short-circuit arises between the gate electrodes and between wirings made of the conductor.

Also, after the formation and removal processes of the silicon dioxide film 9, the silicon dioxide film 10 is formed and then removed from the substrate 1. Therefore, the bird's head state of the field oxide film 7 is cancelled and at the same time, the field oxide film 7 will be more smooth than the case where the formation and removal processes of the silicon dioxide film 10 are not provided.

In the invention, though the formation and removal processes of the silicon dioxide films 9 and 10 are provided, the formation and removal processes of the silicon dioxide film 10 may not be provided, and formation and removal processes of any other silicon dioxide film or films may be added.

In the above embodiment, as the process step of etching the silicon substrate 1, a wet etching method using hydrofluoric acid (HF) is employed; however, any other etchants such as a mixture of hydrofluoric acid (HF) and ammonium fluoride (NH$_4$F) may be employed instead of hydrofluoric acid. Additionally, instead of the wet etching methods, isotropic dry etching methods such as sputtering and plasma-etching may be employed.

Further in addition, instead of the MOS transistors, any other devices or elements such as bipolar transistors may be used.

Though a mask ROM is adopted in the above embodiment, the present invention is not limited to the mask ROM. The invention may be applied to any other semiconductor integrated circuit devices than the mask ROM device, such as Static Random Access Memories (SRAMs), Dynamic Random Access Memories (DRAMs), if they have a patterned field oxide film for isolation on the semiconductor substrate.

While the preferred form of the present invention has been described, it is to be understood that modifications will be apparent to those skilled in the art without departing from the spirit of the invention. The scope of the invention, therefore, is to be determined solely by the following claims.

What is claimed is:

1. A fabrication method of a semiconductor integrated circuit device, said method comprising the steps of:
    (a) forming a pad oxide film on a semiconductor substrate;
    (b) forming a patterned oxidation-resistant film on said pad oxide film;
    (c) thermally oxidizing said substrate to selectively produce a first oxide film for isolation using said patterned oxidation-resistant film as a mask so that active regions are defined on said substrate;
    (d) removing said patterned oxidation-resistant film from said pad oxide film, wherein said first oxide film has protrusions due to the bird's head phenomenon;
    (e) thermally oxidizing said substrate to form a second oxide film under said pad oxide film and said active regions;
    (f) etching said substrate having said first and second oxide films until said second oxide film is entirely removed so that said active regions are exposed and said protrusions of said first oxide film are reduced in size, wherein said size reduction prevents short-circuits caused by conductor material that becomes attached to said protrusions.

2. The fabrication method as claimed in claim 1, wherein said step (f) is carried out by an etching process in which lateral and vertical etching rates are substantially equal to each other.

3. The fabrication method as claimed in claim 1, wherein said step (f) is carried out by a wet etching process.

4. The fabrication method as claimed in claim 1, wherein said oxidation-resistant film is a silicon nitride film.

5. The fabrication method as claimed in claim 1, wherein during said step (f), one of hydrofluoric acid (HF), and a mixture of hydrofluoric acid and ammonium fluoride (NH$_4$F) is used as an etchant.

6. The fabrication method as claimed in claim 1, further comprising the following steps:
    (g) thermally oxidizing said substrate to produce a third oxide film in said active regions to protect the surfaces of said active regions; and
    (h) etching said substrate until said third oxide film is entirely removed so that the surfaces of said active regions are exposed and said first oxide film is partially removed.

7. The fabrication method as claimed in claim 6, wherein during said step (h), one of hydrofluoric acid (HF), and a mixture of hydrofluoric acid and ammonium fluoride (NH4F) is used as an etchant.

8. The fabrication method as claimed in claim 6, further comprising the following steps:
    (i) thermally oxidizing said substrate to form a gate oxide film on said active regions;
    (j) forming a polysilicon film over said gate oxide film and said first field oxide film;
    (k) forming a tungsten silicide film over said polysilicon film; and
    (l) patterning said polysilicon and tungsten silicide films to form gate electrodes by dry etching.

9. The fabrication method as claimed in claim 8, further comprising the following step:
    (m) implanting arsenic ions into said active regions using said first Field oxide film and said gate electrode film as a mask to form source and drain regions.

10. The fabrication method as claimed in claim 9, further comprising the following steps:
    (n) forming a photoresist film over said first field oxide film; and
    (o) patterning said photoresist flint to form windows at positions corresponding to channel areas; and
    (p) implanting phosphorus ions into said channel areas to form diffusion regions through said gate electrodes.

* * * * *